(12) United States Patent
Arai (10) Patent No.: US 8,040,197 B2
(45) Date of Patent: Oct. 18, 2011

(54) CRYSTAL OSCILLATOR

(75) Inventor: Junichi Arai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 45 days.

(21) Appl. No.: 12/606,369

(22) Filed: Oct. 27, 2009

(65) Prior Publication Data

US 2010/0102892 A1    Apr. 29, 2010

(30) Foreign Application Priority Data

Oct. 27, 2008   (JP) ................... 2008-275169

(51) Int. Cl.
*H03B 1/00*   (2006.01)

(52) U.S. Cl. .......... 331/177 V; 331/116 R; 331/116 FE; 331/158; 331/176

(58) Field of Classification Search .............. 331/116 R, 331/116 FE, 158, 176
See application file for complete search history.

(56) References Cited

U.S. PATENT DOCUMENTS

| | | |
|---|---|---|
| 6,617,808 B2 | 9/2003 | Ito et al. |
| 7,023,290 B2 | 4/2006 | Kubo et al. |
| 7,205,858 B2 | 4/2007 | Kato |
| 7,382,204 B2 | 6/2008 | Arai et al. |

FOREIGN PATENT DOCUMENTS

| | | |
|---|---|---|
| JP | 59-118307 | 7/1984 |
| JP | 59-118307 U | 8/1984 |
| JP | 61-081208 | 4/1986 |
| JP | 61-081208 U | 5/1986 |
| JP | 06-085538 | 3/1994 |
| JP | 2002-319498 A | 10/2002 |
| JP | 2003-124747 A | 4/2003 |
| JP | 2005-341191 A | 12/2005 |
| JP | 2006-100526 A | 4/2006 |
| JP | 2006-229665 A | 8/2006 |
| JP | 2006-311496 A | 11/2006 |
| JP | 2007-275453 A | 10/2007 |
| WO | 2005/020427 A1 | 3/2005 |

*Primary Examiner* — Arnold Kinkead (74) *Attorney, Agent, or Firm* — Carrier Blackman & Associates, P.C.; Joseph P. Carrier; William D. Blackman (57) ABSTRACT

A crystal oscillator includes a crystal unit and a voltage-variable capacitive element that is connected to the crystal unit in series, the crystal oscillator varying an oscillation frequency by applying a control voltage between terminals of the voltage-variable capacitive element and by varying a series equivalence capacitance at a side of the oscillator circuit when observed between terminals of the crystal unit. The crystal oscillator further includes a first resistor and a second resistor for dividing the control voltage. At least one of the first resistor and the second resistor is a temperature sensing resistor, the resistance of which changes depending on a temperature, so as to correct frequency temperature characteristics of the oscillation frequency.

9 Claims, 6 Drawing Sheets

RELATED ART

FIG. 6A

RELATED ART

FIG. 6B

RELATED ART

This application claims priority from Japanese Patent Application No. 2008-275169 filed on Oct. 27, 2008, the entire subject matter of which is incorporated herein by reference.

BACKGROUND OF THE INVENTION

1. Field of the Invention

The invention exists in the technical field of a crystal oscillator having frequency temperature characteristics depending on a crystal unit, and in particular relates to a crystal oscillator whose frequency temperature characteristics are corrected within a standard.

2. Description of the Related Art

Since a crystal oscillator has a remarkably higher Q value in comparison with an oscillator using ceramic, etc., and has excellent frequency stability, the crystal oscillator may be incorporated in various types of electronic devices using frequency and time as a reference source. As one type of crystal oscillator, there is a crystal oscillator in which a crystal unit having AT cut as the representative cutting angle and having a frequency band of approximately 10 through 100 MHz is used.

Figure 5:
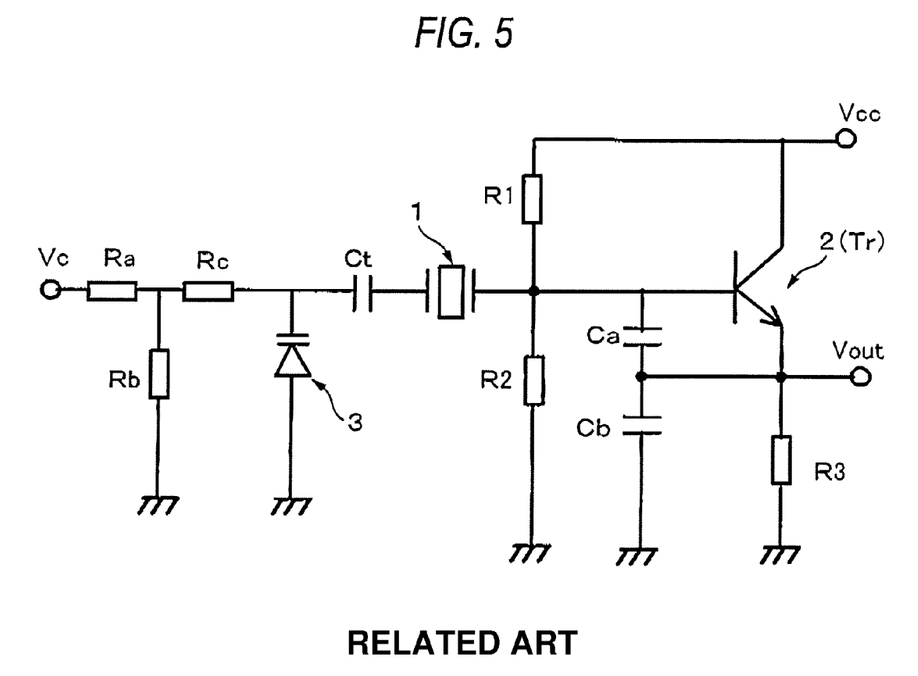
FIG. 5 is a circuit diagram of a related art crystal oscillator.
Figure 6A:
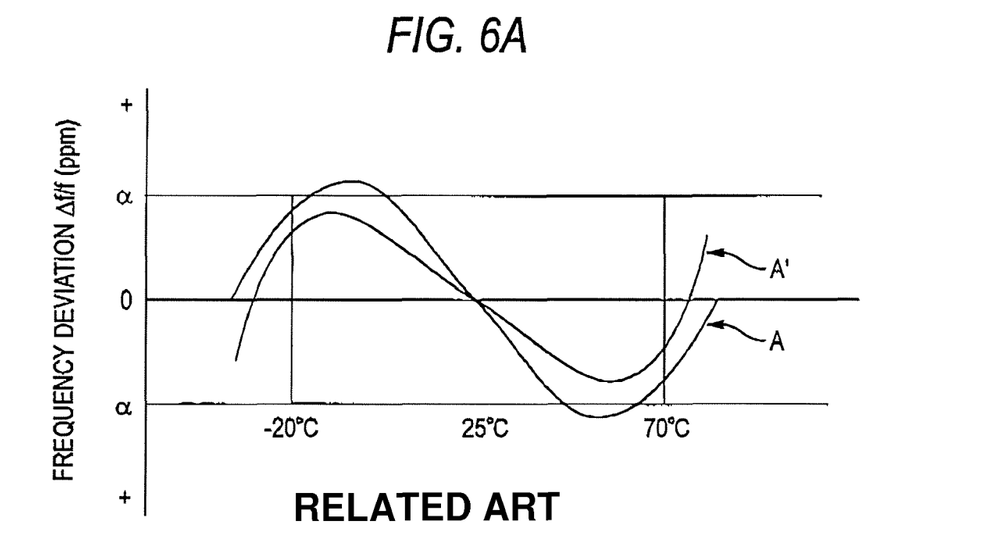
FIGS. 6A and 6B are frequency temperature characteristics views of the related art crystal oscillator.
Figure 6B:
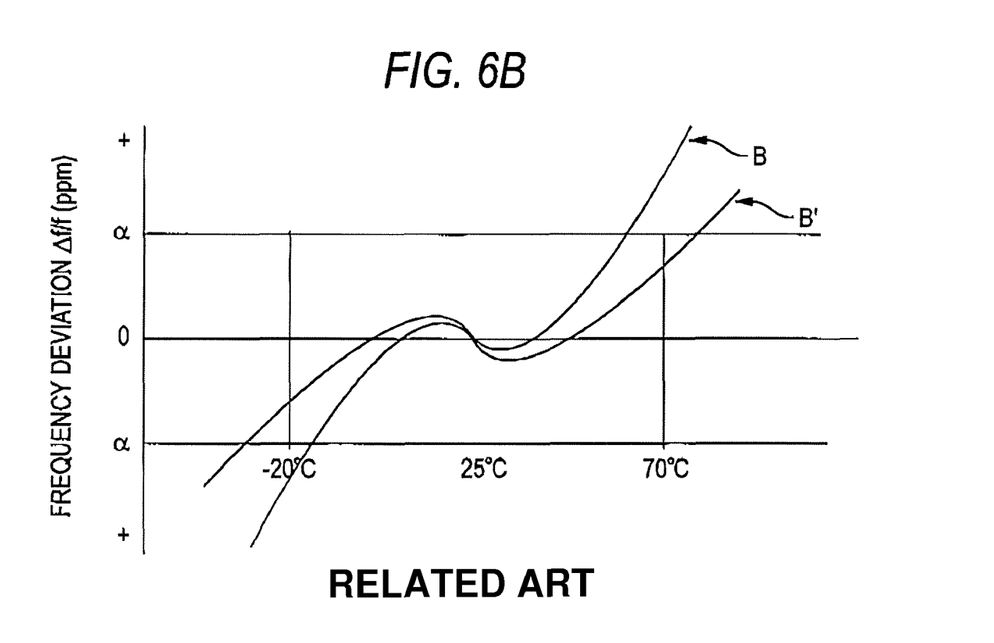

FIGS. 5, 6A and 6B are views describing a related art crystal oscillator, in which FIG. 5 is a circuit diagram of the related art crystal oscillator, and FIGS. 6A and 6B are frequency temperature characteristics views of the related art crystal oscillator.

A crystal oscillator forms a resonance circuit using a voltage dividing capacitor (Ca and Cb) and a crystal unit 1 as an inductor component. The crystal oscillator is made into a so-called Colpitts type oscillator in which an oscillation frequency by the resonance circuit is feedback-amplified by an oscillation amplifier 2. In this example, the oscillation amplifier 2 is made into a common collector as a transistor Tr. A voltage-variable capacitive element (variable capacitance diode) 3 is connected to the crystal unit 1 in series, and a control voltage Vc is applied between terminals of the voltage-variable capacitive element 3.

The control voltage Vc, which is, for example, automatic frequency control voltage (AFC voltage), is input from an AFC circuit incorporated on a set substrate (not illustrated) of an electronic device along with a crystal oscillator. Since the AFC voltage differs in accordance with specifications of an electronic device, the AFC voltage is normally divided and applied by the first resistor Ra and the second resistor Rb. Therefore, by selecting a portion in which the capacitance change of the voltage-variable capacitive element 3 with respect to voltage is linear, the frequency change characteristics of the oscillation frequency are improved. Incidentally, symbols R1, R2 and R3 in the drawings denote bias resistors, RC denotes a high frequency blocking resistor, Ct denotes a frequency-adjusting capacitor, Vcc denotes a power source, and Vout denotes output.

In such a crystal oscillator, the oscillation frequency changes depending on a temperature, particularly depending on the frequency temperature characteristics of a crystal unit (AT cut) 1. In the AT cut crystal unit, the frequency temperature characteristics are made into a cubic curve having an inflection point in the vicinity of normal temperature (approximately 25° C.). In the AT cut crystal unit, a cubic curve (curve A of FIG. 6A) having the maximum value and the minimum value at both sides of the standard temperature range (−20 through 70° C.) and a cubic curve (curve B of FIG. 6B) having the maximum value and the minimum value at a normal temperature side are brought about in accordance with minutely different cutting angles.

And, for example, if the operational temperature of the crystal unit 1 is a constant-temperature type in which the operational temperature of the crystal unit 1 is fixed by a temperature control circuit having a heater (not illustrated), etc., and is stabilized to be high, frequency temperature characteristics (curve A of FIG. 6A) having the maximum value at a high temperature side are selected. In this case, if the operational temperature is set to a normal temperature or less, the temperature cannot be lowered when the temperature exceeds the normal temperature. Therefore, the operational temperature is set to the maximum value over the normal temperature. At the maximum value, a fluctuation width (the amount of change) of the oscillation frequency centering around the temperature is decreased.

Further, in a typical crystal oscillator, since the fluctuation width of the oscillation frequency is suppressed even if the temperature changes from the normal temperature to a low temperature side or a high temperature side, the frequency temperature characteristics (curve B of FIG. 6B) having the maximum value and the minimum value are selected as in the above-described case.

Incidentally, JP-UM-A-59-118307, JP-UM-A-61-81208 and JP-A-6-85538 each discloses a related art crystal oscillator.

However, in the crystal oscillator having the above-described configuration, the frequency temperature characteristics of the crystal oscillator depend on the crystal unit 1, and the frequency temperature characteristics of the crystal unit 1 depend particularly on a delicate cutting angle (in the unit of second). Therefore, strict work is required for cutting the crystal unit 1 (artificial crystal). In addition, if the cutting angle deviates from the standard cutting angle or if influence of the temperature characteristics by other circuit elements is great, the frequency deviation with respect to a temperature becomes below the standard. Thus, there is a problem by which the productivity of crystal oscillators is lowered.

Accordingly, for example, it is considered that a capacitor, which has temperature characteristics, and a capacitance value of which has a positive or negative characteristic, is applied as a capacitor Ct for adjusting the oscillation frequency. That is, the frequency temperature characteristics are brought into the standard by turning the frequency temperature characteristics centering around the normal temperature (i.e., approximately 25° C. of the inflection point) by the temperature characteristics of the capacitor. In summary, the series equivalence capacitance (load capacitance) observed from both ends of the crystal unit 1 is varied by the capacitance of the capacitor changing in accordance with a temperature, and the frequency temperature characteristics are corrected.

For example, for a case where the maximum value or the minimum value of the frequency temperature characteristics at the standard temperature range (−20 through 70° C.) exceeds an allowable deviation ±α ppm as at the curve A in FIG. 6A, a capacitor having a negative characteristic, which slopes down rightward (i.e., which capacitance value is decreased in line with a temperature rise), is applied to the curve A. Therefore, since the capacitance value of the capacitor is decreased in line with a temperature rise to cause the oscillation frequency to increase, the frequency temperature characteristics turn left to cause both the maximum value and the minimum value to be brought into the standard (curve A'). Further, in this case, the standard can be satisfied with frequency temperature characteristics, which is asymmetrical and only the maximum value thereof is outside the standard.

In addition, for a case where the maximum value and the minimum value of the frequency temperature characteristics are brought out of the frequency deviation at both sides inside the standard temperature even the maximum value and the minimum value thereof are within the frequency deviation ±α ppm as at the curve B of FIG. 6B, a capacitor having a positive characteristic, which slopes up rightward (i.e., which capacitance value is increased in line with a temperature rise), is applied. Therefore, since the capacitance value of the capacitor is increased in line with a temperature rise to cause the oscillation frequency to decrease, the frequency temperature characteristics turn right, and are brought into the frequency deviation even at both sides of the standard temperature (curve B' of FIG. 6B). In addition, the standard can be satisfied with the frequency temperature characteristics, in which only the high temperature side thereof is outside the standard.

However, in fact, only a few types of capacitors have temperature characteristics, and most of the capacitors have negative characteristics which slope down rightward. Therefore, in these cases, even it is possible to correct the frequency temperature characteristics by turning right, it is difficult to correct the frequency temperature characteristics by turning left. Further, in either case, for example, only several types (i.e., four types) of capacitors having negative characteristic are available, there are large variation in characteristics among them, and thus it becomes difficult to design and fabricate the crystal oscillator. In particular, in the case of a constant-temperature type crystal oscillator whose frequency deviation is, for example, on the order of ppb (1/10 billion), there is a problem by which delicate adjustment becomes difficult.

SUMMARY OF THE INVENTION

An object of the invention is to provide a crystal oscillator that can facilitate the design by correcting the frequency temperature characteristics.

According to a first aspect of the invention, there is provided a crystal oscillator comprising a crystal unit and a voltage-variable capacitive element that is connected to the crystal unit in series, the crystal oscillator varying an oscillation frequency by applying a control voltage between terminals of the voltage-variable capacitive element and by varying a series equivalence capacitance at a side of the oscillator circuit when observed between terminals of the crystal unit, wherein the crystal oscillator further comprises a first resistor and a second resistor for dividing the control voltage, and wherein at least one of the first resistor and the second resistor is a temperature sensing resistor, the resistance of which changes depending on a temperature, so as to correct frequency temperature characteristics of the oscillation frequency.

According to a second aspect of the invention, in the crystal oscillator, wherein the control voltage is an automatic frequency control voltage divided in advance by the first resistor and the second resistor.

According to a third aspect of the invention, in the crystal oscillator, wherein the crystal oscillator is a constant-temperature type crystal oscillator, in which operational temperature of the crystal unit is made constant.

According to a fourth aspect of the invention, in the crystal oscillator, wherein the control voltage is a divided voltage of a power source voltage of the crystal oscillator.

According to a fifth aspect of the invention, in the crystal oscillator, wherein the temperature sensing resistor is a linear resistor, the resistance value of which linearly changes with respect to the temperature.

According to the aspects of the invention, the control voltage applied to a voltage-variable capacitive element becomes a voltage that changes depending on a temperature by a temperature-sensing resistor. Therefore, since the capacitance of the voltage-variable capacitive element also changes depending on the temperature, the series equivalence capacitance observed between the terminals of a crystal unit may also change. Therefore, if the control voltage is set so as to counterbalance the series equivalence capacitance in compliance with the frequency temperature characteristics, the frequency temperature characteristics can be corrected within the standard. Accordingly, it is possible to improve the productivity of various types of crystal oscillators.

Further, by making at least one of the first resistor and the second resistor being made into a temperature sensing resistor, application of the invention can be facilitated.

According to the third aspect of the invention, it becomes easy to design a highly stabilized oscillator in which the frequency deviation of the oscillation frequency is, for example, on the order of ppb.

Also, according to the aspects of the invention, the frequency temperature characteristics of general crystal oscillators can be easily kept within the standard, and by easily controlling the divided voltages based on the first resistor and the second resistor, the frequency temperature characteristics can be satisfied within the standard.

DETAILED DESCRIPTION OF THE PREFERRED EMBODIMENTS

First Embodiment

Figure 1:
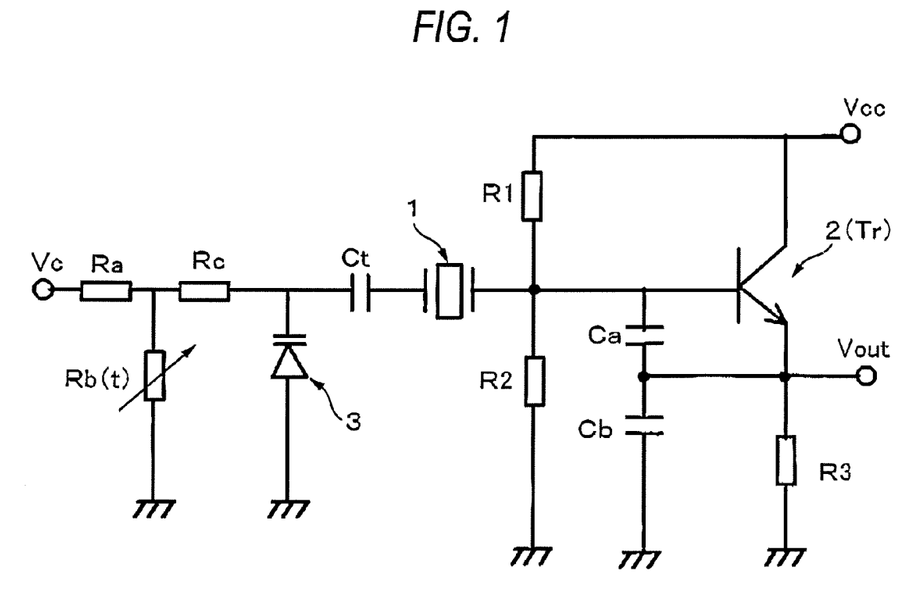
FIG. 1 is a circuit diagram of a crystal oscillator according to a first embodiment of the invention.
Figure 2A:
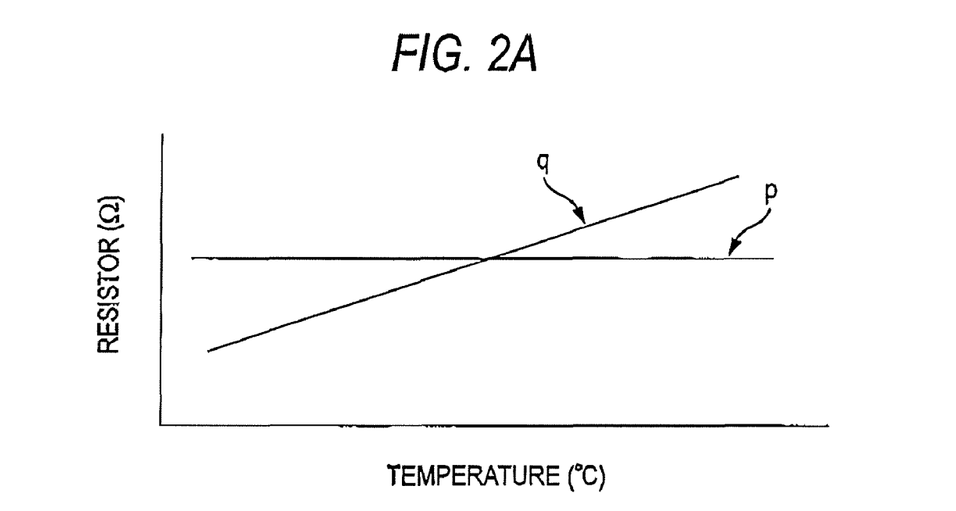
FIG. 2A is a temperature characteristics view of a resistor used for the crystal oscillator.
Figure 2B:
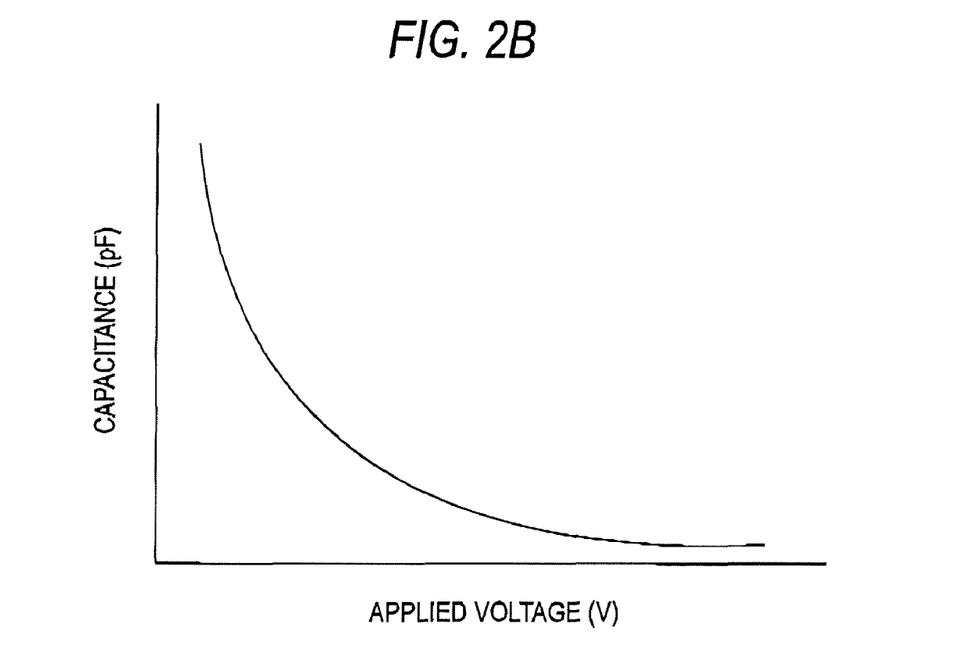
FIG. 2B is a capacitance characteristics view of a voltage-variable capacitive element used for the crystal oscillator.

FIGS. 1 and 2 are diagrams for explanation of a crystal oscillator according to a first embodiment of the invention. FIG. 1 is a circuit diagram of the crystal oscillator. FIG. 2A is a temperature characteristics view of resistors for the crystal oscillator, and FIG. 2B is a capacitance characteristics view of a voltage-variable capacitive element for the crystal oscillator. Incidentally, components that are identical to those of the related art are given the same reference numerals, and the description thereof is simplified or omitted.

As described above, a crystal oscillator forms a voltage dividing capacitor (Ca and Cb) and a resonance circuit using an AT-cut crystal unit 1 as an inductor component and is made into a Colpitts type oscillator that is feedback-amplified by an amplifier 2 (transistor Tr) for common collector oscillator. In this embodiment, a constant-temperature type crystal oscillator, in which particularly the operational temperature of the crystal unit 1 is fixed at 80° C. by a temperature control circuit (not illustrated), is used. The crystal oscillator has an input end to which a control voltage Vc made into AFC voltage is applied.

As described above, the first resistor Ra and the second resistor Rb, which divide the control voltage Vc, are connected between the input end of the control voltage Vc (AFC voltage) and the ground potential. The first resistor Ra is connected to the input end, and the second resistor Rb is connected to the ground potential (reference potential). A divided voltage that is made into a reverse direction voltage is applied from the series connection point of the first resistor Ra and the second resistor Rb to the cathode of the voltage-variable capacitive element 3.

In the first embodiment, the first resistor Ra is made into a constant resistance value with respect to a temperature (curve p of FIG. 2A) as in the related art with respect to a temperature, and the second resistor Rb is made into a temperature sensing resistor Rb(t), the resistance value of which changes depending on the temperature. Here, the temperature sensing resistor Rb(t) is a linear resistor, the resistance value linearly increases in line with an increase in a temperature, that is, the resistor Rb(t) has a positive characteristic (curve q of FIG. 2A).

In such a type, in the control voltage Vc (divided voltage) divided by the first resistor Ra and the second resistor Rb, since the second resistor Rb is a linear resistor Rb(t), the divided voltage at the series connection point changes depending on the temperature. Since the linear resistor Rb(t) of the second resistor Rb has a positive characteristic and is at the ground potential side, as the temperature is raised, a voltage drop in the control voltage Vc (AFC voltage) applied to the input end due to the linear resistor Rb(t) is increased. Therefore, the divided voltage at the series connection point increases in line with an increase in the temperature, and has a positive characteristic with respect to a temperature.

And, as shown in the capacitance characteristics (FIG. 2B) of the voltage-variable capacitive element 3 with respect to application voltage, the greater the application voltage becomes, the less the capacitance value becomes. In other words, the smaller the application voltage becomes, the greater the capacitance becomes. Therefore, the capacitance of the voltage-variable capacitive element 3, to which a divided voltage having a positive characteristic with respect to a temperature is applied, is decreased in line with an increase in a temperature. Thus, the voltage-variable capacitive element 3 may have a negative characteristic with respect to a temperature.

Accordingly, if the temperature increases, since the capacitance value of the voltage-variable capacitive element 3 decreases and the series equivalence capacitance of an oscillator circuit observed from the crystal unit 1 is decreased, the oscillation frequency increases. Therefore, the crystal unit 1 and the frequency temperature characteristics of the oscillation frequency depending thereon turn left centering around the normal temperature (i.e., approximately 25° C. of the inflection point temperature) by an increase in capacitance of the voltage-variable capacitive element 3.

Judging from the above description, the maximum value and the minimum value within the standard temperature (for example, −20 through 70° C.) have the frequency temperature characteristics (curve A of FIG. 6A) exceeding the frequency deviation ±α, the values may be corrected within the standard (curve A' of FIG. 6A). Since the linear resistor Rb(t) linearly changes along with a temperature, the fluctuation ratios at respective temperatures become uniform, wherein the frequency temperature characteristics can be corrected at high accuracy, and the design can be facilitated. Such effects are remarkable, in particular, in the case of a constant-temperature type in which the frequency stability is high on the order of ppb (1/10 billion).

Second Embodiment

Figure 3:
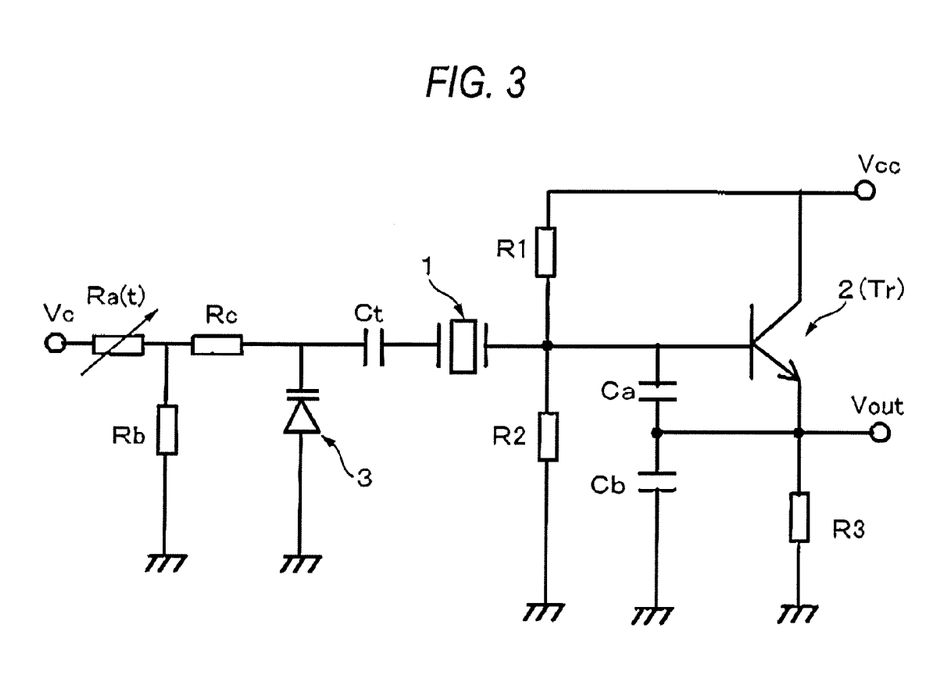
FIG. 3 is a circuit diagram of a crystal oscillator according to a second embodiment of the invention.

FIG. 3 is a circuit diagram of a crystal oscillator according to a second embodiment of the invention. Incidentally, a description of the portions that are identical to those of the first embodiment is omitted or simplified.

In the second embodiment, as in the first embodiment, the crystal oscillator is made into a constant-temperature type in which the operational temperature of the crystal unit 1 is made constant by a temperature control circuit (not illustrated), and has an input end into which the control voltage Vc (AFC voltage) divided by the first resistor Ra and the second resistor Rb is applied. In the second embodiment, contrary to the first embodiment, the first resistor Ra at the input end side is made into a linear resistor Ra(t) of a positive characteristic in which the resistance value linearly increases in line with an increase in a temperature, and the second resistor Rb at the grounding side is made constant with respect to the temperature.

In such a configuration, since the first resistor Ra is made into the linear resistor Ra(t), voltage drop is increased by the linear resistor Ra(t) along with an increase in a temperature. Therefore, the divided voltage at the series connection point with the second resistor Rb is decreased in line with an increase in the temperature, the divided voltage becomes a voltage of negative characteristic with respect to the temperature. The capacitance value of the voltage-variable capacitive element 3 to which the divided voltage (having a negative characteristic) the voltage value of which is decreased with respect to the temperature is applied is increased along with an increase in the temperature, and the capacitance value is made into a capacitance value of positive characteristic with respect to the temperature.

Therefore, the series capacitance of the oscillation circuit, which is observed between the terminals of the crystal unit 1, is increased in line with an increase in a temperature, and the oscillation frequency is decreased. Therefore, in the second embodiment, the oscillation frequency is brought into negative characteristic, by which the oscillation frequency is decreased with respect to a temperature, by the divided voltage based on the linear resistor Ra(t) of the first resistor Ra and the second resistor Rb. Accordingly, the frequency temperature characteristics of the oscillation frequency depending on the crystal unit 1 turn right centering around the inflection point.

Based on the above description, in the second embodiment, the frequency temperature characteristics (curve B of FIG. 6B) exceeding the frequency deviation ±α can be satisfied (curve B' of FIG. 6B) within the standard at both sides of the standard temperature range (−20 through 70° C.). Since the resistance value of the linear resistor Ra(t) linearly changes with respect to the temperature, the fluctuation ratios of the frequency temperature characteristics at respective temperatures is made uniform. Accordingly, it becomes easier to design the crystal oscillator. Therefore, the second embodiment is optimal to a case where the crystal oscillator is made into a constant-temperature type in which the oscillator is highly stabilized.

Third Embodiment

Figure 4A:
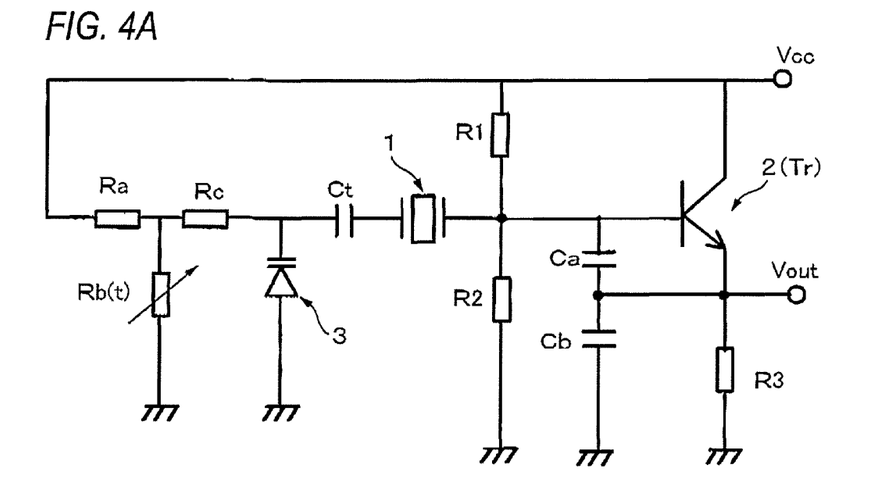
FIGS. 4A and 4B are circuit diagrams of a crystal oscillator according to a third embodiment of the invention.
Figure 4B:
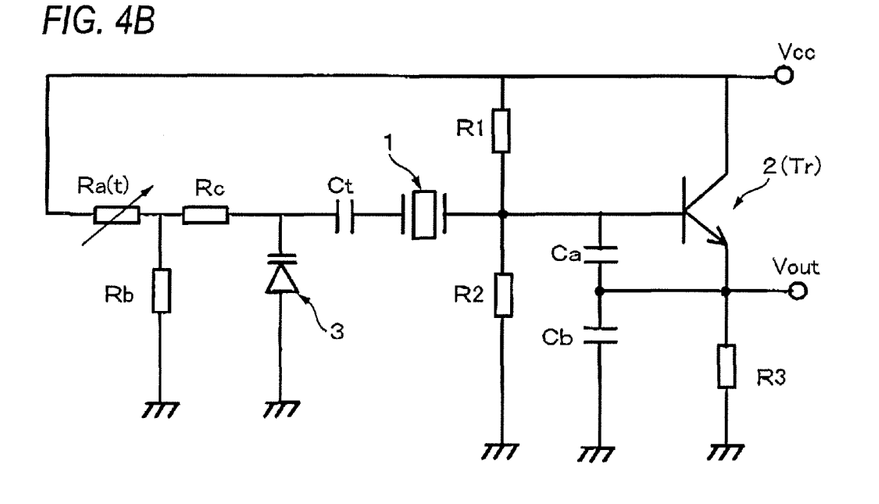

FIGS. 4A and 4B are circuit diagrams of a crystal oscillator according to a third embodiment of the invention. Incidentally, a description of the portions that are identical to those of the above-described embodiments is omitted or simplified.

According to the crystal oscillator of the third embodiment, as similar to a typical crystal oscillator, the power source voltage Vcc is divided by the first resistor Ra and the second resistor Rb instead of the control voltage Vc, and the divided voltage is applied to the cathode of the voltage-variable capacitive element 3. Incidentally, the power source voltage Vcc is applied, for example, as a fixed voltage. Herein, in the third embodiment, the first resistor Ra is made constant with respect to a temperature, and the second resistor Rb is made into a linear resistor Rb(t) (see FIG. 4A). Alternatively, the first resistor Ra is made into a linear resistor Ra(t) and the second resistor Rb is made constant with respect to the temperature (see FIG. 4B).

In these cases according to the third embodiment, as in the first and second embodiments, since the divided voltage applied to the voltage-variable capacitive element 3 has a positive characteristic or a negative characteristic with respect to the temperature, the capacitance of the voltage-variable capacitive element 3 will have a negative characteristic or a positive characteristic with respect to the temperature. Therefore, the frequency temperature characteristics can be corrected with the standard by turning left or right the frequency temperature characteristics depending on the crystal unit 1 on the basis of the normal temperature.

In the above-described embodiments, the temperature-sensing resistor was a linear resistor. Alternatively, a thermistor, a posistor, etc., may be applied to the temperature-sensing resistor. However, the resistance value of the thermistor or posistor exponentially changes with respect to a temperature, and a change in the resistance value is great. That is, the thermistor or posistor is very sensitive. Therefore, correction of the frequency temperature characteristics becomes uneven. Accordingly, the linear resistor is even more favorable than the thermistor or the posistor because the linear resistor has linearity and the resistor change is slight with respect to resistance.

In the above-described embodiments, although the crystal unit is based on AT cut, the crystal unit is not limited thereto. For example, SC cut and IT cut may be acceptable. Further, in the above-described embodiments, although the oscillation amplifier 2 is a transistor Tr, it may be, for example, an inverter. In this case, one or both of the voltage dividing capacitor (Ca and Cb) may concurrently serve as the voltage-variable capacitive element. In addition, it is a matter of course that the crystal oscillator is not limited to a Colpitts type but a positive feedback type in which the series resonance point of the crystal unit is made into an operational point (oscillation frequency) may be applicable thereto.

What is claimed is:

1. A crystal oscillator comprising:
   a crystal unit; and
   a voltage-variable capacitive element that is connected to the crystal unit in series,
   wherein the crystal oscillator varies an oscillation frequency by applying a control voltage between terminals of the voltage-variable capacitive element and by varying a series equivalence capacitance at a side of an oscillator circuit which is observed between terminals of the crystal unit,
   wherein the crystal oscillator further comprises a first resistor and a second resistor for dividing the control voltage,
   wherein at least one of the first resistor and the second resistor is a temperature sensing resistor, the resistance of which changes depending on a temperature, so as to correct frequency temperature characteristics of the oscillation frequency, and
   wherein the control voltage is set so as to counterbalance the series equivalence capacitance in compliance with frequency temperature characteristics such that the frequency temperature characteristics are corrected within a predetermined standard.

2. The crystal oscillator according to claim 1, wherein the control voltage is an automatic frequency control voltage divided in advance by the first resistor and the second resistor.

3. The crystal oscillator according to claim 2, wherein the crystal oscillator is a constant-temperature type crystal oscillator, in which operational temperature of the crystal unit is made constant.

4. The crystal oscillator according to claim 1, wherein the control voltage is a divided voltage of a power source voltage of the crystal oscillator.

5. The crystal oscillator according to claim 1, wherein the temperature sensing resistor is a linear resistor, the resistance value of which linearly changes with respect to the temperature.

6. The crystal oscillator according to claim 1, further comprising:
   a frequency adjusting capacitor that is connected to the crystal unit and the voltage-variable capacitive element in series.

7. The crystal oscillator according to claim 6, wherein a first terminal of the frequency adjusting capacitor is connected to the crystal unit, and
   wherein a second terminal of the frequency adjusting capacitor is connected to the voltage-variable capacitive element and the at least one of the first resistor and the second resistor.

8. The crystal oscillator according to claim 7, wherein the second terminal of the frequency adjusting capacitor is connected to a cathode of the voltage-variable capacitive element and the at least one of the first resistor and the second resistor.

9. The crystal oscillator according to claim 1, wherein the first resistor and the second resistor divide the control voltage and apply the divided control voltage to a cathode of the voltage-variable capacitive element.

* * * * *

UNITED STATES PATENT AND TRADEMARK OFFICE
CERTIFICATE OF CORRECTION

PATENT NO.       : 8,040,197 B2
APPLICATION NO.  : 12/606369
DATED            : October 18, 2011
INVENTOR(S)      : Arai It is certified that error appears in the above-identified patent and that said Letters Patent is hereby corrected as shown below:

On the Title page:
　　　Under Item "(57) ABSTRACT", 11th line, change "depending on a" to --depending on--.

In the Specification:

Column 1:
　　　Line 29, change "views of" to --graphs for--.
　　　Line 32, change "capacitor (Ca and Cb)" to --capacitor structure (Ca and Cb)--.
　　　Lines 47-48, change "divided and applied by" to --divided and applied via--.
　　　Line 49, change "a portion in which" to --a portion of the AFC voltage in which--.
　　　Line 54, change "RC" to --Rc--.
　　　Line 58, change "on a temperature" to --on temperature--.
　　　Line 61, change "are made into" to --graph as--.

Column 2:
　　　Line 3, delete "the operational temperature of".
　　　Line 7, change "and is stabilized" to --and the operational temperature is stabilized--.
　　　Line 25, change "each discloses" to --each disclose--.
　　　Line 36, change "to a temperature" to --to temperature--.
　　　Line 50, change "with a tempera-" to --with tempera- --.
　　　Line 55, change "at the standard" to --in the standard--.
　　　Line 56, change "ppm as at the curve" to --ppm, as shown by curve--.
　　　Lines 57-58, change "which slopes down rightward (i.e.," to --which "slopes down rightward" (i.e.,--.
　　　Line 60, change "curve A" to --crystal oscillator of curve A--.

Signed and Sealed this
Eleventh Day of November, 2014

Michelle K. Lee
*Deputy Director of the United States Patent and Trademark Office*

CERTIFICATE OF CORRECTION (continued)
U.S. Pat. No. 8,040,197 B2

Column 3:
  Line 6, change "ppm as at the curve" to --ppm, as shown by curve--.
  Line 7, change "which slopes up rightward (i.e., which" to --which "slopes up rightward" (i.e., for which--.
  Line 19, change "which slope down rightward. Therefore," to --which "slope down rightward". Therefore,--.
  Line 20, change "even it is" to --even if it is--.
  Line 24, change "negative characteristic" to --negative characteristics--.
  Line 25, change "there are large variation" to --there is large variation--.
  Line 50, change "depending on a temperature" to --depending on temperature--.
  Line 54, delete "wherein".
  Lines 57-58, delete "in the crystal oscillator, wherein".
  Line 62 and line 65, delete "wherein".
  Line 67, change "to the temperature" to --to temperature--.

Column 4:
  Line 3, change "depending on a temperature by a" to --depending on temperature by way of a--.
  Line 6, change "on the temperature" to --on temperature--.
  Line 16, change "being made into" to --be--.
  Line 33 and line 35, change "view of" to --graph for--.
  Line 44, change "views of" to --graphs for--.
  Line 54 and line 55, change "view of" to --graph for--.
  Line 60, change "oscillator forms" to --oscillator comprises--.
  Line 61, change "capacitor (Ca and Cb)" to --capacitor structure (Ca and Cb)--.
  Line 62, change "component and is" to --component, and is--.
  Line 64, change "for common collector oscillator" to --for a common collector oscillator--.

Column 5:
  Line 2, change "Vc made into AFC voltage is" to --Vc, made into AFC voltage, is--.
  Line 14, change "made into a" to --made to have a--.
  Line 15, change "to a temperature" to --to temperature--.
  Line 16, delete "with respect to a tempera-".
  Line 17, delete "ture" (first occurrence only); change "made into" to --made to be--.
  Line 20, change "value linearly" to --value of which linearly--.
  Line 21, change "in a temperature" to --in temperature--.
  Line 24, change "type" to --configuration--.
  Lines 28-29, change "linear resistor Rb(t) of the second resistor Rb" to --linear second resistor Rb(t)--.
  Line 30, between "raised" and "a", delete the ",".
  Line 34, change "in the temperature" to --in temperature--.
  Line 35 and line 44, change "to a temperature" to --to temperature--.
  Line 45, change "in a temperature" to --in temperature--.
  Line 47, change "to a temperature" to --to temperature--.
  Line 58, change "the maximum value" to --if the maximum value--.

CERTIFICATE OF CORRECTION (continued)
U.S. Pat. No. 8,040,197 B2

Column 5 (continued):
    Line 64, change "with a temperature" to --with temperature--.
    Line 66, change "at high" to --with high--.

Column 6:
    Line 2, change "type in which" to --type crystal oscillator in which--.
    Line 16, change "voltage) divided" to --voltage), divided--.
    Line 17, change "resistor Rb is" to --resistor Rb, is--.
    Line 19, change "made into" to --made to be--; after "characteristic" insert a --,--.
    Line 21, change "in a temperature" to --in temperature--.
    Line 22, change "is made constant" to --is made to have a constant resistance value--; change "to the tempera-" to --to tempera- --.
    Lines 24-25, change "made into" to --made to be--.
    Line 26, change "in a temperature" to --in temperature--.
    Line 29, change "in the temperature, the" to --in temperature, and the--.
    Line 30, change "to the tempera-" to --to tempera- --.
    Line 32, change "element 3 to which the divided voltage (having a negative" to --element 3, to which the divided voltage having a negative--.
    Line 33, change "characteristic) the voltage value of which is decreased with" to --characteristic (i.e., the voltage value of which decreases) with--.
    Line 34, change "to the temperature is applied is increased" to --to temperature is applied, is increased--.
    Line 35, change "in the temperature" to --in temperature--.
    Line 36, change "made into a capacitance value of positive" to --made to have a positive--.
    Line 37, change "to the temperature" to --to temperature--.
    Line 40, change "in a temperature" to --in temperature--.
    Lines 43-44, change "characteristic, by which the oscillation frequency is decreased with respect to a temperature," to --characteristic (i.e., the oscillation frequency decreases with respect to a temperature increase)--.
    Line 56, change "to the temperature" to --to temperature--.
    Line 58, change "tures is made" to --tures are made--.

Column 7:
    Lines 5-6, change "voltage Vcc is divided by the first resistor Ra and the second resistor Rb instead of the control voltage Vc," to --voltage Vcc, instead of the control voltage Vc, is divided by the first resistor Ra and the second resistor Rb,--.
    Lines 10-11, change "is made constant with respect to a temperature" to --is made to have a constant resistance value with respect to temperature--.
    Lines 11-12 and line 13, change "made into" to --made to be--.
    Line 14, change "is made constant with respect to the tem-" to --is made to have a constant resistance value with respect to tem- --.
    Line 20, change "to the temperature" to --to temperature--.
    Line 22, change "to the tempera-" to --to tempera- --.

CERTIFICATE OF CORRECTION (continued)

Column 7 (continued):
    Line 24, change "with the standard" to --within the standard--.
    Lines 31-32, change "respect to a temperature" to --respect to temperature--.
    Lines 37-38, change "and the resistor change is slight with respect to resistance." to --and the resistance change is slight.--.
    Lines 44-45, change "voltage dividing capacitor (Ca and Cb)" to --capacitors (Ca and Cb) that form the voltage dividing capacitor structure--.
    Line 48, change "type but a" to --type, and a--.

In the Claims:

Column 8:
    Line 11, change "on a temperature" to --on temperature--.